United States Patent [19]

Anjum et al.

[11] Patent Number: 5,550,084
[45] Date of Patent: Aug. 27, 1996

[54] INTEGRATED CIRCUIT FABRICATION USING A METAL SILICIDE HAVING A SPUTTERDEPOSITED METAL NITRIDE LAYER

[75] Inventors: Mohammed Anjum; Ibrahim K. Burki, both of Austin; Craig W. Christian, Buda, all of Tex.

[73] Assignee: Advanced Micro Devices, Inc., Sunnyvale, Calif.

[21] Appl. No.: 375,126

[22] Filed: Jan. 17, 1995

Related U.S. Application Data

[63] Continuation-in-part of Ser. No. 183,485, Jan. 19, 1994.
[51] Int. Cl.[6] .............................. H01L 21/44; H01L 21/48
[52] U.S. Cl. ..................... 437/200; 437/192; 437/247; 148/DIG. 169
[58] Field of Search ...................... 437/200, 192, 437/190, 247, 949; 148/DIG. 158, DIG. 169

[56] References Cited

U.S. PATENT DOCUMENTS

| | | | |
|---|---|---|---|
| 4,998,157 | 3/1991 | Yokoyama et al. | 437/200 |
| 5,043,300 | 8/1991 | Nulman | 437/174 |
| 5,242,860 | 9/1993 | Nulman | 437/200 |
| 5,278,099 | 1/1994 | Maeda | 437/192 |

OTHER PUBLICATIONS

Miller, "Titanium Silicide Formation by RTA: Device Implications", *1st International RTP Conference*, (RTP, 1993) Sep. 8–10, 1993, pp. 156–159.
Wolf, Silicon processing for VLSI ERA, vol. 2 pp. 132–133 anid 166–167.

*Primary Examiner*—Mary Wilczewski
*Assistant Examiner*—Jey H. Tsai
*Attorney, Agent, or Firm*—Kevin L. Daffer

[57] ABSTRACT

An improved method is provided for fabricating a metal silicide upon a semiconductor substrate. The method advantageously places a film of metal nitride upon the metal layer. The metal nitride layer and metal layer are sputter deposited within the same chamber without removing the substrate from the vacuum so as to prevent oxygen or moisture from contaminating the metal layer and causing oxides to form thereon. Furthermore, the metal nitride layer is reactively sputter deposited in a nitrogen/argon ambient to allow precise amounts of nitrogen to be deposited across uneven surface topography directly adjacent to the underlying metal layer. Excess nitrogen purposefully deposited within the metal nitride layer consumes a controlled depth of metal bond sites within the underlying metal layer so as to limit the amount of silicidation from underlying silicon or polysilicon into the metal thereby substantially eliminating or minimizing silicide shorting problems.

18 Claims, 3 Drawing Sheets

INTEGRATED CIRCUIT FABRICATION USING A METAL SILICIDE HAVING A SPUTTERDEPOSITED METAL NITRIDE LAYER

This is a continuation-in-part of application Ser. No. 08/183,485 filed Jan. 19, 1994 abandoned.

BACKGROUND OF THE INVENTION

1. Field of the Invention

This invention relates to integrated circuit manufacture and more particularly to the fabrication of a metal silicide with silicon barrier characteristics.

2. Description of the Relevant Art

Fabrication of an integrated circuit involves numerous processing steps. After impurity regions have been deposited within a semiconductor substrate and gate areas defined upon the substrate, interconnect routing is placed on the semiconductor topography and connected to contact areas thereon to form an integrated circuit. The entire process of making an ohmic contact to the contact areas and routing interconnect material between ohmic contacts is described generally as "metallization". While materials other than metals are often used, the term metallization is generic in its application and is derived from the origins of interconnect technology, where metals were the first conductors used. As the complexity of integrated circuits has increased, the complexity of the metallization composition has also increased.

In order to form highly conductive ohmic contacts in the connecting region or "window 38 between the interconnects (generally aluminum), it is oftentimes necessary to incorporate a layer of refractory metal at the juncture. The refractory metal, when subjected to high enough temperature, reacts in the contact window to form what is commonly called a "silicide". Silicides are well known in the art and provide dependable silicon contact as well as low ohmic resistance.

Silicides have gained in popularity due to the shrinking dimensions of the contact window. As the contact window decreases, it is important that contact resistance remain relatively low. For that reason, silicides remain a mainstay in semiconductor processing. However, as device dimensions shrink, so does the spacing between contact windows. Any lateral migration of silicide occurring between closely spaced contact windows must be carefully monitored and controlled. Otherwise, a phenomenon often referred to as "silicide shorting" can occur.

Silicide shorting often arises when the refractory metal is titanium, and where titanium silicide is allowed to form between silicon contact windows, wherein the silicon comprises, e.g., a polysilicon gate and/or a silicon source/drain area. In a lightly doped drain (LDD) process, a sidewall spacer normally exists in the region between the polysilicon gate and source/drain areas. The sidewall spacer is fairly small in size and can allow titanium silicide formation over a portion of or the entire spacer thereby providing a capacitive-coupled or fully conductive path between the polysilicon gate and the source/drain region. See, e.g., Miller, "Titanium Silicide Formation by RTA: Device Implications", *First International RTP Conference*, (RTP, 1993) Sep. 8–10, 1993.

FIG. 1 is provided to better understand the phenomenon of silicide shorting as it pertains to LDD technology. FIG. 1 illustrates a cross-sectional view along plane A—A of FIG. 2, wherein an MOS device 10 is shown having a pair of source/drain regions 12, a polysilicon gate 14 and pair of sidewall spacers 16, all of which are formed between field oxide areas 18. FIG. 1 illustrates a MOS processing methodology occurring after silicide formation but before the patterning of overlying interconnect. Silicide 20 is formed in the contact windows between the interconnect (not shown) and underlying silicon (i.e., source/drain silicon regions 12 and gate polysilicon 14). Silicide 20 can be fairly thin, similar to gate oxide 22. When formed, silicon underneath silicide 20 (i.e., silicon from threshold adjust implant area 24, LDD implant 26, and/or source/drain implant 28 of substrate 30) can, when heated, diffuse into the refractory metal and react therewith. The reacted metal silicide regions 20 remain after etch, as shown. Refractory metal can, in some instances, react with silicon in the $SiO_2$ sidewall spacer or can migrate along spacer 16 between source/drain 12 and polysilicon 14 to form unwanted silicide 20 over spacer 16. Silicide upon spacer 16 can, over time, creep toward one another in the direction indicated by the arrows. Eventual corrosion-induced connection or shorting of silicide 20 over spacer 16 may occur thereby presenting a device reliability problem. Corrosion-induced shorting or "silicide shorting" may be caused by moisture leaking into the integrated circuit, underneath the passivation layer. It is postulated that the moisture provides electrolysis along electric current flow path thereby bridging contaminant materials along the path and between adjacent silicides 20 overlying spacer 16.

In an effort to overcome silicide shorting problems, many researchers advocate a multiple step process. First, a refractory metal such as titanium is deposited over the entire wafer. Next, the metal film is heated to a low temperature in the presence of a nitrogen ambient in order to form a reacted, relatively high-resistance silicide in the contact windows. Next, the unreacted metal is removed using a wet chemical etch (e.g., $NH_4OH:H_2O_2:H_2O$) thereby leaving reacted metal or metal silicide in the contact windows. Finally, a higher temperature anneal is performed in order to produce a lower resistivity silicide. Two anneal steps are necessary in order to prevent unwanted or excessive silicide formation which would occur if the first anneal temperature is comparable to the second (highest) anneal temperature. Thus, first anneal must be maintained at a maximum temperature of approximately 600°–700° C., while the subsequent anneal can extend up to approximately 800° C.

The introduction of nitrogen into the first anneal process step is important in order for the nitrogen to diffuse into the metal and effectively nitrate the upper surface of the metal during the same time in which the lower surface of the metal forms silicide. It is possible that the anneal temperature can be excessive and nitrogen incorporation/nitridation can be minimal. Absent nitrogen atoms, which are used to compete with the titanium-silicon bonds forming in the silicide, complete silicidation of the metal can occur.

Not only is it important to carefully control the amount of silicidation as well as nitridation, and to strike a balance between the two, but it is also important to minimize exposure of the refractory metal to oxygen during silicide formation. In the two step anneal process described above, after the first anneal is completed within an RTA chamber, the silicon substrate is removed from the chamber and subjected to a wet etch. Withdrawal of the substrate from the chamber allows native oxides or other impurities to grow or deposit upon the reacted metal silicide. The native oxides or impurities cannot, in all instances, be removed by wet etch thereby leaving deleterious amounts of oxides and impurities in the contact window. It is well known that oxides in the contact window can, inter alia, impede or substantially reduce conductivity within the contact window.

A still further problem with the two step anneal process described above is the need to carefully monitor first anneal temperatures. If first anneal temperatures exceed a specified amount, then excessive silicidation can occur in the contact area with minimum simultaneous nitridation. However, when the contact window comprises a heavy doped source/drain region, it is oftentimes necessary to increase silicidation temperature given the relative absence of silicon (in proportion to impurity atoms) within the source/drain. Higher temperature anneal necessary to effectuate silicidation in the heavy doped source/drain contact windows may increase silicidation in the source/drains but lead to excessive silicidation in other contact regions, such as a lightly doped polysilicon, where silicon atoms are plentiful.

SUMMARY OF THE INVENTION

The problems outlined above are in large part solved by the silicide fabrication process of the present invention. That is, a silicide process is provided which incorporates nitrogen at the upper surface of the refractory metal (e.g., titanium) prior to silicidation. Moreover, silicidation can occur using a single anneal cycle, wherein the pre-existing nitrogen near the upper surface of the refractory metal helps ensure a controlled amount of silicidation and substantially prevents or minimizes silicide shorting between closely spaced contact windows.

The pre-existing nitrogen is achieved by sputter depositing metal across the upper surface of the contact windows, and then sputter depositing metal nitride across the upper surface of the metal layer. Both sputter steps occur within a single sputter chamber thereby substantially minimizing any oxygen or moisture ingress into the upper surface of the metal layer (i.e., while the wafer remains in vacuum throughout both steps). Accordingly, silicidation occurs by thereafter heating in the absence of nitrogen the combination metal nitride and metal layers at a high temperature without the deleterious formation of oxide upon the metal layer. After silicidation occurs within the metal layer a specified distance controlled by simultaneous movement of nitrogen from the metal nitride layer, unreacted metal is removed by wet etch. The present process not only minimizes oxide growth upon the metal layer, but also allows for a higher temperature, single anneal step necessary for simultaneously providing (i) low resistivity silicide and (ii) proper silicidation rate at both heavy and light doped silicon contact regions. A higher temperature single anneal step can provide uniform silicidation in heavy or light doped areas by ensuring a fairly precise nitrogen density is sputter deposited at the upper surface of the metal layer. The carefully controlled nitrogen content of the metal nitride layer will help monitor the amount of silicidation regardless of underlayer silicon contact and anneal temperature. The nitrogen content of the metal nitride layer is uniformly maintained and applied during silicidation by eliminating additional, non-uniform nitrogen ingress from a silicidation step. Thus, nitrogen, nitrogen-bearing compound or nitrogen-bearing gas is voided from the chamber which performs silicidation. Any ingress of nitrogen into the chamber which performs silicidation may lead to uneven nitridation in the silicon contact regions.

Broadly speaking, the present invention contemplates a method for fabricating a metal silicide upon a semiconductor substrate. The method comprises the steps of providing a semiconductor substrate having a impurity region and a polysilicon region configured across a portion of the substrate. The substrate is then inserted into a sputter chamber and a metal layer is thereby formed across the semiconductor substrate. Without removing the substrate from the sputter chamber, excess nitrogen is added to the chamber and a metal nitride layer rich in nitrogen is reactively sputter deposited upon the metal layer. Thereafter, the substrate is heated in order to react the metal layer with the impurity region and the polysilicon region so as to form a metal silicide at the interface. The metal nitride layer and the unreacted metal layer is then removed from the semiconductor substrate in order to achieve a metal silicide having improved process characteristics described herein.

It is important that the semiconductor substrate be retained with the sputter chamber in the interim between the formation of the metal layer and the overlying metal nitride layer so as to prevent intervening exposure of the metal layer to an oxygen or moisture containing atmosphere. Moreover, the present method utilizes a single heating step, wherein the semiconductor substrate can be heated to a temperature approximately equal to or exceeding 800° C. A single, high temperature anneal cycle allows silicide formation and rapid conversion of the silicide to a high conductivity material having a sheet resistance less than approximately 5 $\Omega$/square. Alternatively, another anneal step can be used after the metal nitride layer and unreacted metal layer are removed. The second anneal step can be performed at a higher temperature than the first anneal temperature of approximately 800° C.

Generally speaking, the step of heating the semiconductor substrate allows movement of nitrogen atoms from the metal nitride layer simultaneous with movement of silicon atoms from the impurity region and the polysilicon region. The excess nitrogen atoms leave the metal nitride layer and move into the metal layer where they bond with metal atoms contained therein. The bonded nitrogen and metal atoms control distance of movement of silicon atoms into the metal layer from the underlying silicon contact regions. The bonded nitrogen and metal atoms are predominately present throughout a first distance x into the metal layer from the metal nitride layer. The silicon atoms substantially cease movement into the metal layer after the silicon atoms move a distance y into the metal layer from the substrate. The distance y is equal to the thickness of the metal layer minus x, wherein x is greater than y. Preferably, distance y is less than one- fourth a distance separating the impurity region from the polysilicon region.

The metal layer comprises any refractory metal, a suitable refractory metal is titanium (Ti), wherein the metal nitride layer comprises TiN. So as to allow movement of excess nitrogen atoms from the TiN layer to the underlying Ti layer during the anneal step, the TiN layer is non-stoichiometric and contains an excess amount of nitrogen atoms which freely diffuse during the nitridation/anneal step. The non-stoichiometric amounts are closely controlled by the argon/nitrogen sputter gas ratio and/or the total chamber gas pressure/flow, and can be of any range depending upon the amount of nitrogen needed during the subsequent anneal step. If higher temperatures are necessary to effectuate fully silicided low resistivity contacts in heavy $n^+$ (As) doped impurity regions (source/drain regions) then nitrogen composition, as a proportion of the TiN target material or chamber ambient, can be readily and easily controlled.

BRIEF DESCRIPTION OF THE DRAWINGS

Other objects and advantages of the invention will become apparent upon reading the following description and upon reference to accompanying drawings in which.

Figure 8:
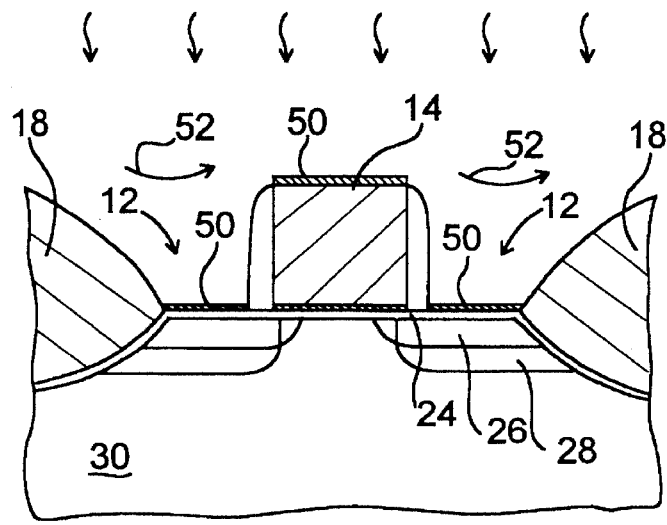
FIG. 8 is a cross-sectional view along plane A—A of FIG. 2 showing an MOS transistor partially fabricated during a processing step according to another exemplary embodiment of the present invention.

While the invention is susceptible to various modifications and alternative forms, specific embodiments thereof are shown by way of example in the drawings and will herein be described in detail. It should be understood, however, that the drawings and descriptions thereto are not intended to limit the intention to the particular forms disclosed, but, on the contrary, the invention is to cover all modifications, equivalents and alternatives falling within the spirit and scope of the present invention as defined by the appended claims.

DETAILED DESCRIPTION OF THE INVENTION

Figure 2:
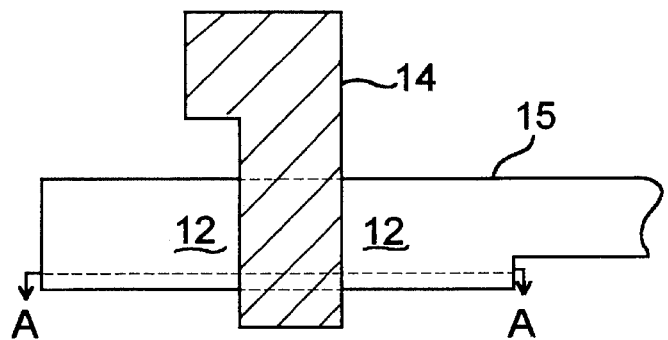
FIG. 2 is a top plan view of an MOS transistor having impurity regions and a polysilicon region placed upon a semiconductor substrate.

Turning now to FIG. 2, a circuit topography of a semiconductor substrate 30 is shown. The topography includes an MOS transistor (either P-type or N-type transistor) using self-aligned polysilicon gate 14 placed above an active diffusion or implantation area 15. Active area 15 includes areas upon substrate 30 void of field oxide. Active areas 15 include impurity regions or source/drain regions 12, all of which will be described in further detail below.

Figure 3:
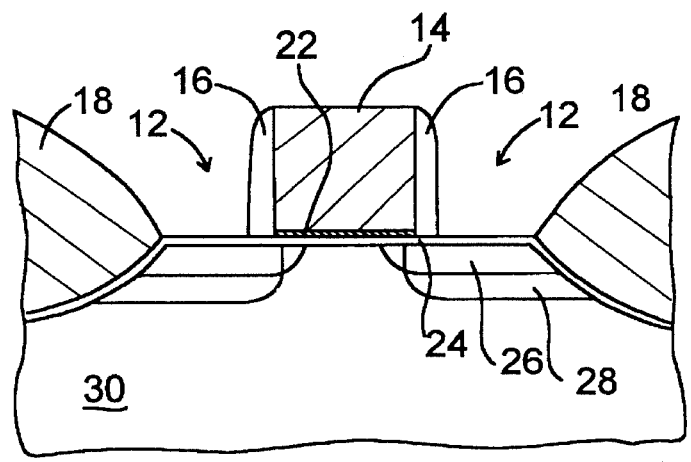
FIG. 3 is a cross-sectional view along plane A—A of FIG. 2 showing an MOS transistor partially fabricated during a processing step according to the present invention.

FIG. 3 illustrates a cross-sectional view along plane A—A of FIG. 2. It is appreciated from the drawings of FIGS. 2 and 3 that a metallization layer (not shown) can be placed on the upper surface of the substrate topography and brought in contact with various contact windows located upon the topography. Contact windows include metallization contact to underlying silicon materials, such as polysilicon 14 and source/drain regions 12. For sake of clarity, overlying metallization layers and subsequent processing steps are not shown. However, it is understood that the silicide process hereof, as described below, is purposefully used to provide high quality ohmic contact of metallization placed within contact windows.

FIG. 3 illustrates well-known MOS processing using lightly doped drain (LDD) technology necessary to form various implant regions, such as LDD implant 26, source/drain implant 28 and threshold adjust/channel stop implant 24. Formed at the upper surface of substrate 30 is a patterned polysilicon 14 overlying a thin gate oxide 22. Laterally spaced from and adjacent to polysilicon 14 are sidewall spacers 16 which, inter alia, help to prevent problems such as "short channel effects" and "hot carrier injection".

Figure 4:
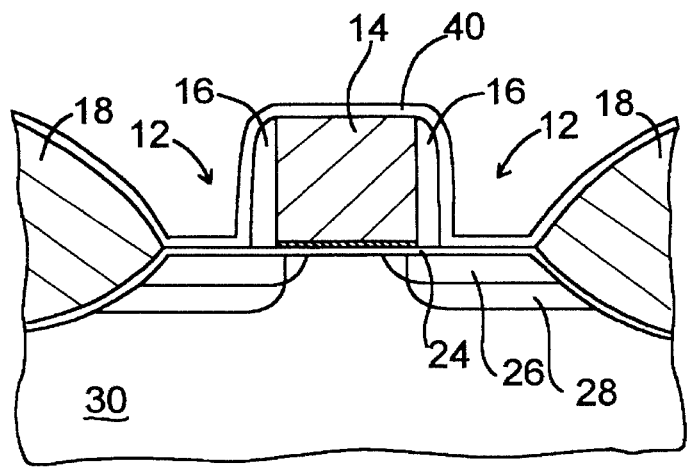
FIG. 4 is a cross-sectional view along plane A—A of FIG. 2 of an MOS transistor partially fabricated during another processing step according to the present invention.

Due to shrinking device sizes, and primarily to smaller sidewall spacers 16, problems often arise during the silicide formation, which occurs after the implants, polysilicon and sidewall spacers are formed. In order to minimize or eliminate silicide shorting upon sidewall spacer 16 and the "creeping" of silicide from the upper polysilicon surface to source/drain regions 12, precautions must be taken to improve the silicide process. As shown in FIG. 4, the improved silicide process begins with sputter depositing a thin layer (generally less than 1000 Å) of refractory metal 40 across the entire upper topography of substrate 30. A suitable composition of metal layer 40 includes Ti. Prior to sputter of metal layer 40, the upper surface of substrate 30 can be cleaned in a HF solution in order to remove any native oxides which may have formed upon the substrate. As such, metal layer 40 is advantageously placed directly upon the upper surface of the substrate without intervening oxides which could increase the ohmic contact resistance of the ensuing silicide.

Figure 5:
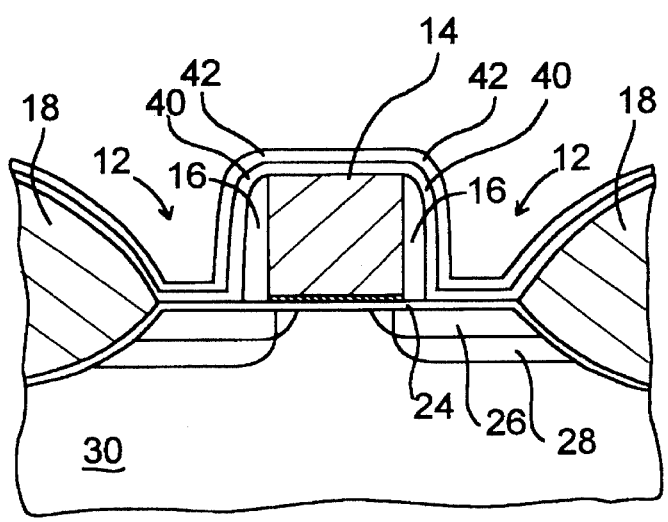
FIG. 5 is a cross-sectional view along plane A—A of FIG. 2 of an MOS transistor partially fabricated according to a further processing step according to the present invention.

Referring to FIG. 5, a cross-sectional view along plane A—A of FIG. 2 is shown during another processing step subsequent to the step shown in FIG. 4. Specifically, FIG. 5 illustrates a metal nitride layer 42 (e.g., TiN) placed across the entire substrate topography and directly upon metal layer 40. In order to ensure layer 42 is placed directly upon layer 40, deposition of both layers occur within a sputter chamber, taking care not to open the sputter chamber in the interim between the sputter deposition of layer 40 and subsequent deposition of layer 42. By maintaining both sputter operations in the same chamber, and without breaking the integrity of the chamber, an interim sputter etch or wet etch operation is not needed to remove any deleterious metal oxide that may have formed upon the metal layer 40. Sputter of metal nitride layer 42 can occur in a RF system. The target material can be chosen as having the same relative composition of metal nitride as that which is sputtered to form layer 42. Alternatively, a metal target can be used in a nitrogen ambient to provide metal nitride layer 42. If a nitrogen ambient is used, nitrogen is added to the sputter chamber after layer 40 is formed and just prior to and during subsequent sputter operation of layer 42. Nitrogen flow rate and sputter chamber pressure is controlled depending upon the amount of nitrogen necessary in metal nitride layer 42. An important aspect of adding nitrogen to the sputter chamber is to ensure a precise amount of nitrogen is reactively sputter deposited upon metal layer 40 as metal nitride layer 42. The deposited nitride can be assured of a uniform and fairly precise density value across the entire topography—regardless of the unevenness of the topography. Even in areas between steep hills and valleys of the topography, deposition assures that precise amounts of nitrogen are placed in those areas so as to control subsequent silicidation across the entire substrate (i.e., not only at the metal/silicon juncture, but in areas slightly displaced or adjacent to the metal/silicon juncture).

Figure 6:
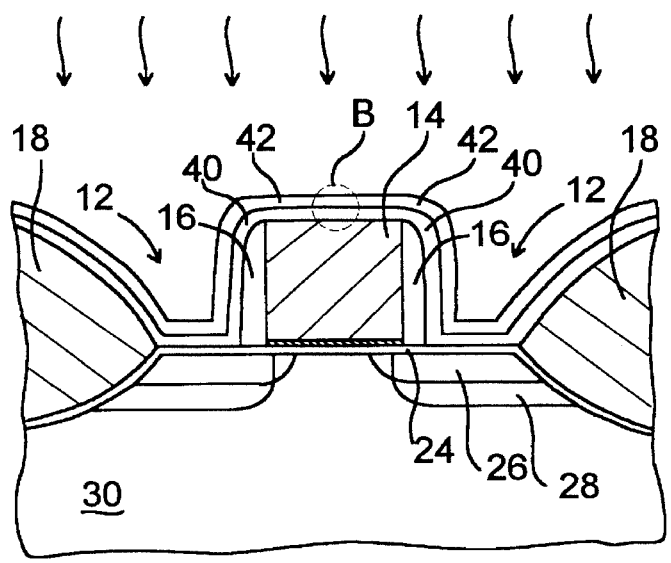
FIG. 6 is a cross-sectional view along plane A—A of FIG. 2 of an MOS transistor partially fabricated during yet another processing step according to the present invention.
Figure 7:
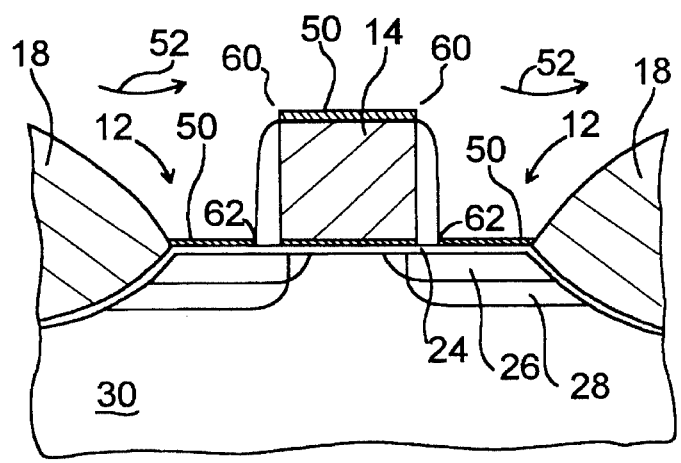
FIG. 7 is a cross-sectional view along plane A—A of FIG. 2 of an MOS transistor partially fabricated during yet still another processing step according to the present invention.

Referring to FIG. 6, a subsequent processing step is shown in which the combination of metal layer 40 and metal nitride layer 42 is subjected to a thermal anneal cycle. By thermally heating substrate 30 in a chamber void of nitrogen or nitrogen-bearing compounds/gases the silicon regions 12 and 14 which contacts metal layer 40 react in the contact window areas to form a silicide 50, as shown in FIG. 7. The nitride within metal nitride layer 42 helps prevent oxygen from penetrating the combination layers 40 and 42 and reacting with underlying silicon. Thus, an important aspect of the layered combination 40 and 42 is to prevent oxide formation after the substrate is removed from the sputter chamber and subjected to a single high temperature anneal (i.e., anneal temperatures exceeding 800° C.) and generally less than 1000° C. By minimizing oxide upon the upper surface, subsequent removal of metal nitride layer 42 and unreacted metal layer 40 can be more easily accomplished. Reacted metal layer 40 occurs at the metal/silicon juncture, and all other areas of metal nitride are removed using, for example, a wet chemical etch ($NH_4OH$:$H_2O_2$:$H_2O$). Wet etch and flow removal is shown by arrows 52 in FIG. 7.

An important advantage of the present fabrication methodology is the use of a single anneal cycle prior to wet etch and removal of unreacted metal layer 40. The single anneal cycle, shown in FIG. 6, can utilize a high enough temperature to ensure proper silicidation in heavy doped source/drain regions 12. High temperature anneal will not cause excess silicidation in areas of lightly doped concentrations, such as would cause, e.g., spiking of metallization completely through the contact or junction area. Presence of accurate amounts of nitrogen in a uniform density across the upper surface of metal layer 40 via metal nitride layer 42 ensures proper nitridation and blocking of light or heavy concentrations of silicon atoms moving from the underlying silicon into metal layer 40, along the spacer wall as will be described below. Elimination of nitrogen from the anneal chamber helps ensure that non-uniform nitrogen will not be added to the pre-existing uniform nitrogen sputter deposited in metal nitride layer 42. An anneal chamber bearing nitrogen could deleteriously place an unacceptable concentration of nitrogen in areas predominately exposed to the nitrogen flow. For example, nitrogen dense regions deleteriously formed during nitrogen-bearing anneal could comprise topological peaks of the wafer, as opposed to topological valleys. Sputter-deposited nitrogen is therefore used as a sole means for ensuring uniform nitrogen across the entire topological surface, i.e., within peaks as well as valleys.

Turning now to FIG. 8, a second anneal step can be used, if so desired. The second anneal may occur after wet etch and removal of unreacted metal 40. If a single anneal occurs (single anneal occurring only before wet etch), then the anneal temperature can be quite high, a suitable temperature being approximately 800° C. or higher. However, if two anneal cycles are desired, the first anneal (the anneal occurring before wet etch) takes place at approximately 600° C., and the second anneal (the anneal occurring after wet etch) takes place at approximately 800° C. or higher. The first anneal, if a lower temperature anneal is used, is provided only to perform controlled amounts of silicidation, wherein silicide 50 is a composition of metal and $Si_x$ (where x is approximately equal to one). Subsequent anneal step shown in FIG. 8, occurs at higher temperatures in order to reduce the resistivity in the contact window by increasing conductivity of silicide 50, wherein silicide 50 comprises a metal and $Si_x$ (where x is approximately equal to two or greater). If metal layer 40 comprises Ti, then the resulting low resistivity silicide is titanium disilicide, titanium trisilicide, etc. Either a single anneal processing embodiment or a dual anneal processing embodiment falls within the spirit and scope of the present invention. However, only a single anneal need be used, if desired, to perform both silicide and low resistivity titanium disilicide in the contact regions.

Figure 9:
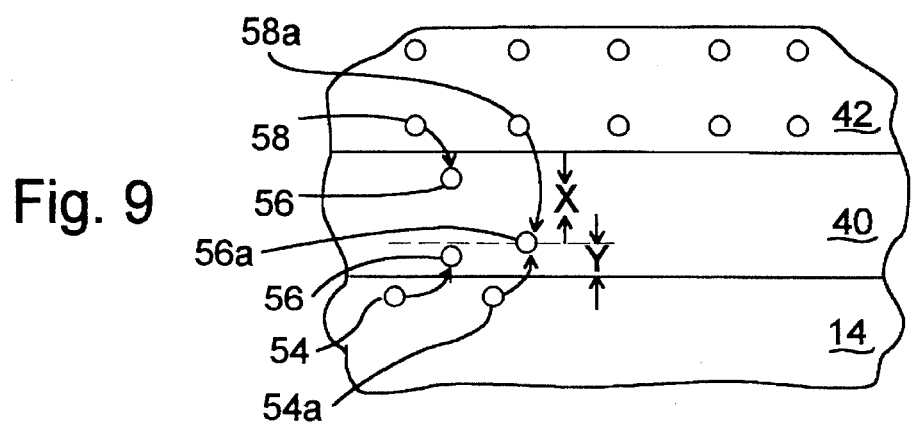
FIG. 9 is an atomic view along detail area B of FIG. 6.
Figure 1:
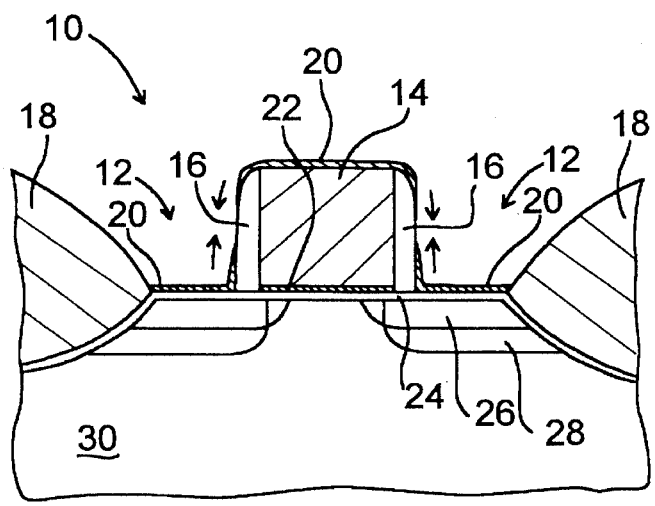
FIG. 1 is a cross-sectional view along plane A—A of FIG. 2 showing an MOS transistor partially fabricated according to a prior fabrication methodology.

Turning now to FIG. 9, an atomic view of detail area B of FIG. 6 is shown. In particular, the atomic implications of anneal and the affect upon metal layer 40 is shown. Metal layer 40 is sandwiched directly between polysilicon region 14 (or possibly silicon region 30) and overlying metal nitride layer 42. During silicidation, as brought about by the anneal step, silicon atoms 54 migrate or move from polysilicon 14 to bond with metal atoms 56 contained within metal layer 40. At the same time, nitrogen atoms 58 move from metal nitride layer 42 to bond with metal atoms 56 within metal layer 40. The density of atomic nitrogen 58 is controlled during metal nitride sputter deposition such that an abundance of free, non-bonded nitrogen atoms 58 exists within layer 42. The excess nitrogen atoms in layer 42 are very loosely bound to one another with bonds strength much smaller than the bond strength between, e.g., titanium and nitrogen.

The propensity for nitrogen atoms to break their bond amongst one another and move to metal bond sites 56, and the relative mobility of nitrogen, in relation to silicon, allows nitrogen from layer 42 to penetrate deeper within layer 40 than silicon from layer 14. As such, silicon atom 54a is blocked from bonding to metal atom 56a due to the occurrence of a pre-existing bond of nitrogen atom 58a with metal atom 56a, caused by the higher mobility of the nitrogen and lower bond strength between nitrogen. Accordingly, the depth of silicide formation is closely controlled by the concentration of nitrogen within layer 42. Bonded nitrogen and metal atoms occur predominately throughout a first distance x into metal layer 40, as measured from metal nitride layer 42. Likewise, silicon atoms bond with metal atoms throughout a second distance y as measured from the silicon or polysilicon layer. The bonded nitrogen and metal atoms cause silicon atoms to substantially cease movement into metal layer 40 after the silicon atoms move a distance y into the metal layer. Distance y is equal to the thickness of the metal layer minus distance x, and preferably distance x is greater than distance y. In order to substantially eliminate or minimize silicidation between the upper surface of polysilicon 14 and source/drain regions 12 (along spacer 16), it is important to closely control the depth of silicidation by providing a relatively uniform nitrogen concentration along the spacer as well as at the upper surface of polysilicon 14 and source/drain regions 12. Nitrogen within layer 42, spaced from sidewall spacer 16, ensures silicidation does not occur laterally downward from upper surface polysilicon layer 14 or laterally upward from source/drain regions 12. Such formation would cause eventual silicide shorting and reliability problems if corrosion were allowed to form along the sidewall spacers between the distal ends of the spaced silicides. As such, fine line bifurcation occurs at the outside edges 60 of polysilicon 14 and the outside edges 62 of source/drain regions 12, as shown in FIG. 7.

It will be appreciated to those skilled in the art having the benefit of this disclosure that this invention is believed to be capable of applications with numerous metallization schemes upon vastly dissimilar silicon substrate topographies. Moreover, it is also to be understood that the form of the invention shown and described is to be taken as exemplary presently preferred embodiments. Various modifications and changes may be made without departing from the spirit and scope of the invention as set forth in the claims. An exemplary modification might be one which uses refractory metals other than titanium, or which avoids use of LDD spacers. Any densely spaced plurality of contact regions, requiring close control of silicide formation regardless of the contact material or the spacer configuration between contacts, fall within the spirit and scope of the invention as defined by the claims. It is intended that the following claims be interpreted to embrace all such modifications and changes.

What is claimed is:

1. A method for fabricating a metal silicide upon a semiconductor substrate, comprising the steps of:

provided a semiconductor substrate comprising an impurity region and a polysilicon region configured across a portion of said substrate;

forming within a sputter chamber a metal layer across said semiconductor substrate;

without removing said semiconductor substrate from said sputter chamber, forming in the presence of a nitrogen and argon ambient a metal nitride layer upon said metal layer;

heating said semiconductor substrate in the absence of a nitrogen ambient to a temperature approximately between 800° C. to 1000° C. to react said metal layer with said impurity region and said polysilicon region in order to form a metal silicide; and removing said metal nitride layer and unreacted said metal layer from said semiconductor substrate.

2. The method as recited in claim 1, wherein said metal layer comprises Ti and said metal nitride layer comprises TiN.

3. The method as recited in claim 1, wherein said metal nitride layer is non-stoichiometric and contains an excess amount of nitrogen atoms.

4. The method as recited in claim 1, wherein said without removing step comprises retaining said semiconductor substrate within said sputter chamber and forming said metal nitride layer without intervening exposure of said metal layer to an oxygen or moisture-containing atmosphere.

5. The method as recited in claim 1, wherein said without removing step comprises retaining said semiconductor substrate within said sputter chamber and forming said metal nitride layer without intervening exposure of said metal nitride layer to an oxygen or moisture-containing atmosphere.

6. The method as recited in claim 1, further comprising the step of re-heating said semiconductor substrate to a temperature approximately between 800° C. to 1000° C. in order to convert said metal silicide to a high conductivity metal silicide having a sheet resistance less than 5 $\Omega$/square.

7. The method as recited in claim 1, wherein said heating step comprises nitrogen atoms moving from said metal nitride layer simultaneous with silicon atoms moving from said impurity region and said polysilicon region, wherein said nitrogen atoms are moved into said metal layer and bond with metal atoms contained therein and, wherein said bonded nitrogen and metal atoms control distance of movement of silicon atoms into said metal layer.

8. The method as recited in claim 7, wherein a majority of said bonded nitrogen and metal atoms are present throughout a first distance x into said metal layer from said metal nitride layer, and a majority of said silicon atoms cease movement into said metal layer after said silicon atoms move a distance y into said metal layer from said substrate, wherein distance y is equal to the thickness of said metal layer minus x, and wherein x is greater than y.

9. The method as recited in claim 8, wherein said distance y is less than one fourth a distance separating said impurity region from said polysilicon region.

10. A method for fabricating a metal silicide having silicon barrier characteristics, comprising the steps of:

providing a substrate comprising silicon;

forming within a sputter chamber a metal layer across said substrate;

without removing said semiconductor substrate from said sputter chamber, forming in the presence of a nitrogen and argon ambient a metal nitride layer upon said metal layer; and heating said substrate in the absence of nitrogen ambient to a temperature approximately between 800° C. to 1000° C. to cause nitrogen atoms to move from said metal nitride layer simultaneous with silicon atoms moving from said substrate, wherein said nitrogen atoms are moved into said metal layer and bond with metal atoms contained therein and, wherein said bonded nitrogen and metal atoms occupy bond sites to which said silicon atoms move and, whereby the presence of said bond sites control distance of movement of silicon atoms into said metal layer.

11. The method as recited in claim 10, wherein said metal layer comprises Ti and said metal nitride layer comprises TiN.

12. The method as recited in claim 10, wherein said metal nitride layer is non-stoichiometric and contains an excess amount of nitrogen atoms.

13. The method as recited in claim 10, wherein said without removing step comprises retaining said substrate within said sputter chamber and forming said metal nitride layer without intervening exposure of said metal layer to an oxygen or moisture-containing atmosphere.

14. The method as recited in claim 10, wherein a majority of said bonded nitrogen and metal atoms are present throughout a first distance x into said metal layer from said metal nitride layer, and a majority of said silicon atoms cease movement into said metal layer after said silicon atoms move a distance y into said metal layer from said substrate, wherein distance y is equal to the thickness of said metal layer minus x, and wherein x is greater than y.

15. The method as recited in claim 10, further comprising the step of re-heating said substrate to a temperature approximately between 800° C. to 1000° C. in order to convert said metal silicide to a high conductivity metal silicide having a sheet resistance less than 5 $\Omega$/square.

16. A method for forming a conductive contact to an electronic device, comprising the steps of:

providing a silicon substrate having thereon at least two areas to be contacted;

forming within a sputter chamber a metal layer across said two areas;

without removing said silicon substrate from said sputter chamber, forming in the presence of a nitrogen ambient a metal nitride layer upon said metal layer; and heating said silicon substrate in the absence of a nitrogen ambient to a temperature approximately between 800° C. to 1000° C. to cause nitrogen atoms to move from said metal nitride layer simultaneous with silicon atoms moving from said silicon substrate, wherein said nitrogen atoms are moved into said metal layer and bond with metal atoms contained therein and, wherein a majority of said bonded nitrogen and metal atoms occupy bond sites present throughout a first distance x into said metal layer from said metal nitride layer, whereby a majority of said silicon atoms cease movement into said metal layer after said silicon atoms move a distance y into said metal layer from said silicon substrate and, wherein said distance y is equal to the thickness of said metal layer minus x and, wherein y is less than one fourth a distance separating said two areas.

17. The method as recited in claim 16, wherein said metal layer comprises Ti and said metal nitride layer comprises TiN.

18. The method as recited in claim 16, wherein said metal nitride layer is non-stoichiometric and contains an excess amount of nitrogen atoms.

* * * * *

UNITED STATES PATENT AND TRADEMARK OFFICE
CERTIFICATE OF CORRECTION

PATENT NO. : 5,550,084

DATED : August 27, 1996

INVENTOR(S) : Mohammed Anjum; Ibrahim K. Burki; and Craig W. Christian

It is certified that error appears in the above-identified patent and that said Letters Patent is hereby corrected as shown below:

On the title page, item [54], and column 1, line 3, insert a space between the words "SPUTTER" and "DEPOSITED".

Claim 10, col. 9, line 65, please delete the word "semiconductor".

Signed and Sealed this

Twenty-fifth Day of November, 1997

Attest:

BRUCE LEHMAN

Attesting Officer

Commissioner of Patents and Trademarks